United States Patent
Matsumoto et al.

(10) Patent No.: US 6,621,352 B2
(45) Date of Patent: Sep. 16, 2003

(54) SEMICONDUCTOR INTEGRATED CIRCUIT DEVICE

(75) Inventors: Takashi Matsumoto, Ome (JP); Hikaru Suzuki, Fussa (JP); Mitsugu Kusunoki, Kunitachi (JP)

(73) Assignees: Hitachi, Ltd., Tokyo (JP); Hitachi Information Technology Co., Ltd., Kanagawa-ken (JP)

( * ) Notice: Subject to any disclaimer, the term of this patent is extended or adjusted under 35 U.S.C. 154(b) by 131 days.

(21) Appl. No.: 09/983,968

(22) Filed: Oct. 26, 2001

(65) Prior Publication Data

US 2002/0053048 A1 May 2, 2002

(30) Foreign Application Priority Data

Oct. 30, 2000 (JP) ........................................ 2000-329770

(51) Int. Cl.[7] .................................................. H03L 7/00
(52) U.S. Cl. .................. 331/1 A; 331/25; 331/DIG. 2; 331/44; 327/156; 327/159
(58) Field of Search ............................ 331/1 A, 16, 17, 331/18, 25, DIG. 2, 44; 327/156–159

(56) References Cited

FOREIGN PATENT DOCUMENTS

| JP | 6-104746 | 9/1992 | | |
|---|---|---|---|---|
| JP | 9-197024 | 1/1996 | | |
| JP | 11-2666 | 6/1997 | | |
| JP | 11-23662 | 7/1997 | | |
| JP | 2000-35463 | 7/1998 | | |
| JP | 2002-131389 | * | 5/2002 | ........... G01R/31/28 |

* cited by examiner

Primary Examiner—David C. Mis

(57) ABSTRACT

There is provided a semiconductor integrated circuit device for realizing in the higher accuracy the verification of a plurality of operations of a clock generation circuit to form an internal clock signal and enabling verification for various performances of the internal clock signal generation circuit while simplifying the structure thereof. In such semiconductor integrated circuit device, a measuring circuit for conducting at least two kinds of measurements among the measurements of lock time until the predetermined internal clock signal corresponding to the input clock signal can be obtained, the maximum frequency of the internal clock signal and jitter of the internal clock signal is provided to the clock generation circuit to form the internal clock signal corresponding to the input clock signal inputted from an external terminal. Thereby, operations of the clock generation circuit can be verified with higher accuracy within the semiconductor integrated circuit device.

11 Claims, 13 Drawing Sheets

DIGITAL VARIABLE DELAY CIRCUIT

- (5) FETCH OF 1024/1024 EDGES
- (4) FETCH OF 860/1024 EDGES
- (3) FETCH OF 512/1024 EDGES
- (2) FETCH OF 164/1024 EDGES
- (1) FETCH OF 0/1024 EDGES

RESIN PKG

EXCLUSIVE PIN

CERAMIC PKG

EXCLUSIVE PIN

SEMICONDUCTOR INTEGRATED CIRCUIT DEVICE

BACKGROUND OF THE INVENTION

1. Field of the Invention

The present invention relates to a semiconductor integrated circuit device and particularly to the technology that can be effectively applied to the measuring technique for semiconductor integrated circuit devices provided with a clock generating circuit for generating an internal clock signal corresponding to the clock signal which is supplied from an external terminal.

2. Description of the Related Art

The search for references after application of the present invention has reported that an integrated circuit with PLL circuit provided with a jitter measuring circuit is disclosed in Japanese laid-open patent JP-A No. 2000-35463, an integrated circuit with PLL circuit provided with a detection circuit for evaluating jitter is disclosed in Japanese laid-open patent JP-A No. H6-104746, an integrated circuit with PLL circuit provided with a test circuit for calculating a lock time is disclosed in Japanese laid-open patent JP-A No. H11-2666, an integrated circuit provided with a frequency measuring circuit is disclosed in Japanese laid-open patent JP-A No. H11-23662 and an integrated circuit with PLL circuit provided with a frequency measuring circuit is disclosed in Japanese laid-open patent JP-A No. H9-197024.

Researches are aided to improvement in the operation rate of a circuit with advancement of the semiconductor technology. For example, in a semiconductor integrated circuit device for data input/output operation synchronized with the clock signal of the frequency of 500 MHz or higher, an occupation rate of delay of signal in an input circuit for fetching, to the integrated circuit, the clock signal inputted from an external terminal for the clock period can not be neglected. An internal clock signal having compensated for signal delay in the input circuit can be formed with use of a PLL circuit or DLL circuit.

Circuit elements formed in a semiconductor integrated circuit has comparatively large fluctuation in process. On the occasion of comprising a PLL or DLL circuit as explained above and forming an internal clock signal of high frequency as explained above, it can be thought that measurement to determine whether such clock signal should satisfy the desired frequency, phase or jitter characteristic or the like is now indispensable. Therefore, it can also be thought to use a high precision analog tester but in this case, an exclusive high-speed input/output circuit including the measuring terminals is required and moreover highly accurate determination becomes difficult even when an expensive measuring circuit is used because a signal delay in such input/output circuit becomes a serious problem. In addition, in the measuring circuit described in the above official gazettes, measurement accuracy is low and such measuring circuit is inadequate for PLL or DLL circuit which operates even in such higher frequency.

SUMMARY OF THE INVENTION

An object of the present invention is to provide a semiconductor integrated circuit device that has realized verification with higher accuracy of a plurality of operations for a clock generating circuit to form an internal clock signal. Another object of the present invention is to provide a semiconductor integrated circuit device that has enabled, through simplification of a structure, verification of various performances of an internal clock signal generating circuit. The abovementioned and other objects and novel characteristics of the present invention will be become more apparent from description of this specification and accompanying drawings thereof.

Typical inventions among those disclosed in this specification will be outlined below. For the clock generating circuit to form an internal clock signal corresponding to an input clock signal inputted from an external terminal, a measuring circuit for measuring at least two or more items among the lock time until the desired internal clock signal corresponding to the input signal is obtained, the maximum frequency of the internal clock signal and the jitter of the internal clock signal is provided in order to execute, with higher accuracy, verification for operations of the clock generating circuit in the semiconductor integrated circuit.

DESCRIPTION OF THE PREFERRED EMBODIMENTS

Figure 1:
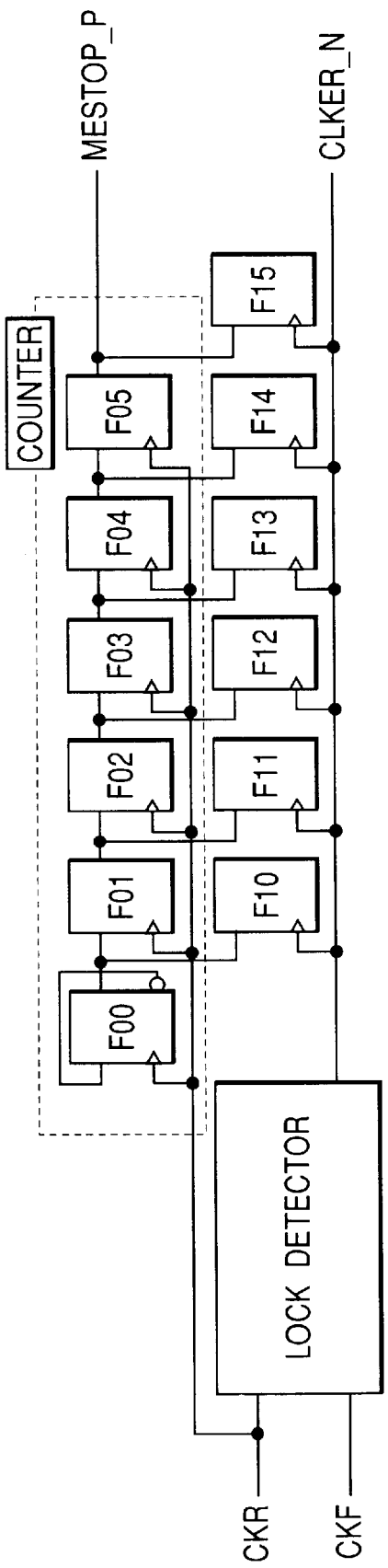
FIG. 1 is a block diagram showing an embodiment of a measuring circuit provided in a semiconductor integrated circuit device of the present invention.

FIG. 1 is a block diagram of an embodiment of a measuring circuit provided in the semiconductor integrated circuit device of the present invention. The measuring circuit of this embodiment automatically measures a lock time, namely the time until the PLL circuit locks the phase and is stabled in operation from the start of operation thereof.

A lock detector changes a detection signal CLKER_N to logic 1 from logic 0 when a phase difference between the reference clock signal CKR corresponding to the clock signal supplied from an external terminal and the feedback clock signal CKF corresponding to the internal clock signal formed with an oscillation circuit VCO of PLL is within the specified error assumed as the lock condition. Namely, the lock detector sets the detection signal CLKER_N to logic 0 in the asynchronous condition and also sets to logic 1 in synchronous condition.

The flip-flop circuits F00 to F05 form a counter circuit to count up the reference clock CKR. An output signal of each stage of this counter is supplied to the data input terminals of the flip-flop circuits F10 to F15 and the detection signal CLKER_N is supplied to the clock terminal thereof. Each flip-flop circuit F10 to F15 fetches and holds the counted value of the counter circuits F00 to F05 supplied in synchronization with the edge of the detection signal CLKER_N supplied to the clock terminal which has changed to high level (logic 1) from low level (logic 0).

A carry output signal MESTOP_P of the final stage of the counter circuit is defined as the measurement stop signal. The number of stages of counter circuit, namely the maximum count value is set larger than the maximum value of the allowable lock time of PLL because of the relationship with the period of the reference clock signal CKR. Namely, even when the measurement stop signal MESTOP_P corresponding to the carry-over of the counter circuit is generated, if the detection signal CLKER_N is maintained at the logic 0 corresponding to the asynchronous condition, such condition is defined as PLL lock failure. When the measurement stop signal MESTOP_P is generated, the flip-flop circuits F10 to F15 execute the shift operation to output serially the counted value being held as the lock time through a test circuit BIST and an input/output interface JTAG explained later.

Figure 9:
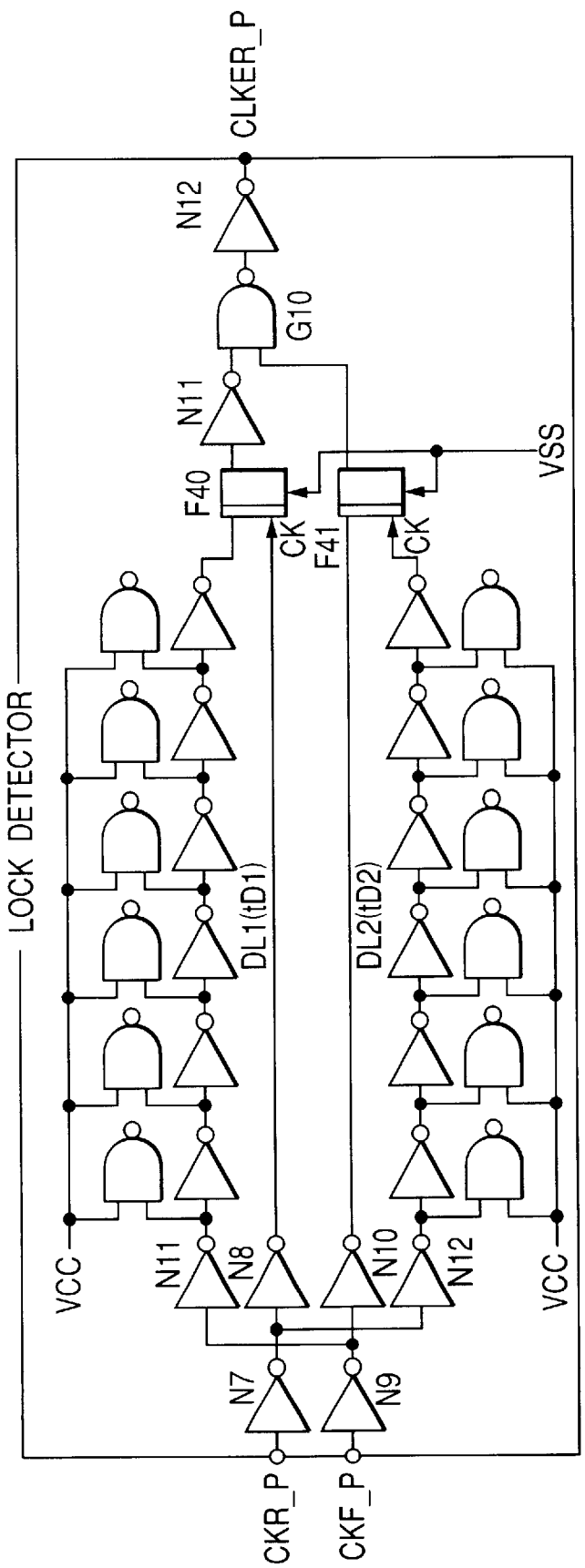
FIG. 9 is a circuit diagram showing an embodiment of a lock detector of FIG. 1.

FIG. 9 shows a circuit diagram of an embodiment of the lock detector. The reference clock signal CKR_P is supplied to the clock terminal CK of the flip-flop circuit F40 through inverter circuits N1 and N8. The feedback clock signal CKF_P is supplied to a data input terminal of the flip-flop circuit F41 through inverter circuits N9 and N10. The reference clock signal CKR_P is supplied to the clock terminal CK of flip-flop circuit F41 through an inverter circuit N7, an inverter circuit N12 and a delay circuit DL2. The feedback clock signal CKF_P is supplied to the data input terminal of flip-flop circuit F40 through an inverter circuit N9, an inverter circuit N11 and a delay circuit DL1.

The delay circuits DL1 and DL2 are respectively formed of a serial circuit of a plurality of inverter circuits and each stage is provided with an additional Miller capacitance to set a longer delay time. Namely, a gate circuit, which operates as an inverter circuit when a high level (logic 1) such as a power supply voltage VDD is steadily supplied thereto, is also provided. Thereby, the Miller capacitance detected when an output signal from the gate circuit is inverted for the input signal is connected to the output terminal of the inverter circuit of the serial condition and the desired delay time can be obtained with a comparatively small number of inverter circuits.

The delay times tD1 and tD2 of the delay circuits DL1 and DL2 are defined as the delay time corresponding to a phase difference assuming that the PLL is in the phase-locked condition. Thereby, under the lock condition, since a phase difference of both clock signals CKR_P and CKF_P is smaller than the delay times tD1, tD2 of the delay circuits DL1 and DL2, when attention is paid to the flip-flop circuit F40, the timing in which the feedback clock signal CKF_P is changed to high level from low level after the delay time of tD1 explained above for the edge in which the reference clock signal CKR_O is changed to high level from low level. Therefore, the low level is fetched. Focusing on the flip-flop circuit F41, since the edge in which the reference clock signal CKR_O changes to high level from low level is delayed as long as the delay time of tD2, the feedback clock signal CKF_P which has changed to the high level from low level is fetched and thereby the high level can be outputted.

Since a phase difference between both clock signals CKR_P and CKF_P is larger than the delay times tD1, tD2 of the delay circuits DL1, DL2 under the non-lock condition, focusing on the flip-flop circuit F40, change of the feedback clock signal CKF_P to high level from low level is delayed as long as the delay time tD1 for the edge of the reference clock signal CKR_P to change to high level from low level. Therefore, when the phase of the feedback clock signal CKF_P is leading for the reference clock signal CKR_P, the high level is fetched and when the phase is delayed, the low level is fetched.

On the other hand, focusing on the flip-flop circuit F41, since the edge of the reference clock signal CKR_O to change to high level from low level is delayed as long as the delay time tD2, when the phase of the feedback clock signal CKF_P is leading for the reference clock signal CKR_P, high level of the feedback clock signal CKF_P is fetched and when the phase is delayed, low level is fetched.

As a result, when the phase of the feedback clock signal CKF_P is leading to the delay times tD1, tD2 assuming to result in the lock condition for the reference clock signal CKR_P, the output signals of the flip-flop circuits F40 and F41 become high level. When the phase is delayed, on the contrary, from the delay times tD1, tD2, the output signals of the flip-flop circuits F40 and F41 become low level. As a result, in the logic circuit forming of the inverter circuits N11, N12 for receiving both output signals and a gate circuit G10, only when the flip-flop circuits F40 and F41 under the lock condition are set to provide the low level and high level, the output signal CLKER_P becomes high level but low level under the non-lock-condition.

Figure 2:
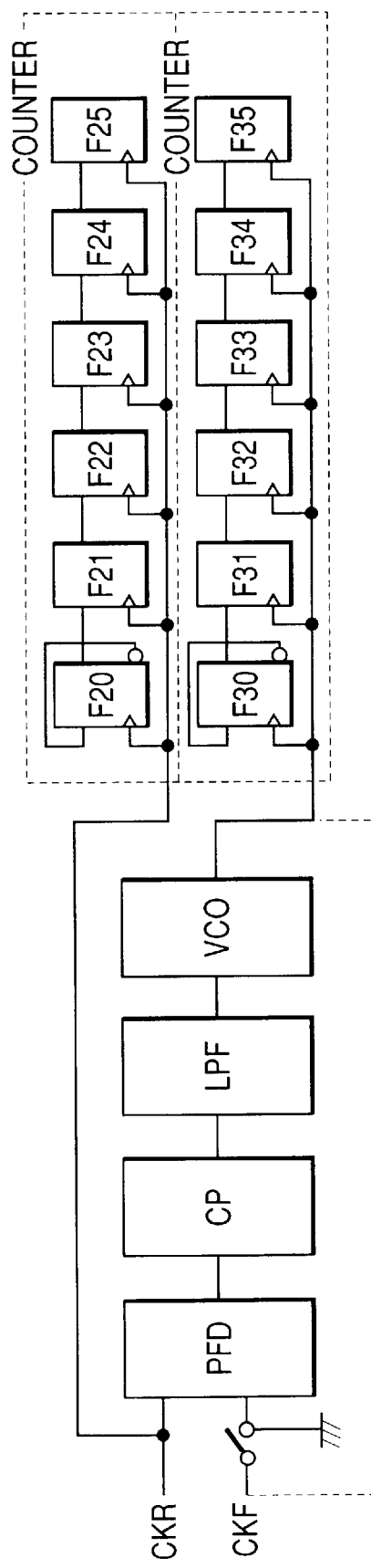
FIG. 2 is a block diagram showing another embodiment of a measuring circuit provided in a semiconductor integrated circuit device of the present invention.

FIG. 2 shows a block diagram of another embodiment of a measuring circuit provided in the semiconductor integrated circuit device of the present invention is shown. The measuring circuit of this embodiment automatically measures the maximum oscillation frequency of an oscillation circuit VCO forming the PLL. The PLL circuit is schematically formed of a phase comparator PFD, a charge pump circuit CP, a low-pass filter LPF and an oscillation circuit VCO. Namely, the phase comparator PFD compares the phases (frequency comparison) of the reference clock signal CKR corresponding to the clock signal supplied from the external terminal and the internal clock formed on the basis of the oscillation signal formed in the oscillation circuit VCO, namely the feedback clock signal CKF and drives the charge pump circuit CP with a phase output corresponding to the phase difference (frequency difference) to form a control voltage of the oscillation circuit VCO in combination with the low-pass filter. Thereby, the oscillating operation of the oscillation circuit VCO is controlled to realize matching between the phases (frequencies) of both clock signals CKR and CKF.

In this embodiment, a counter for receiving the reference clock signal CKR and a counter for receiving the clock signal corresponding to the oscillation signal of the oscillation circuit VCO are provided. In order to oscillate the oscillation circuit VCO in the maximum frequency, the DC level is supplied to the feedback clock signal CKF for the phase comparator PFD by cutting off the PLL loop with a switch. For example, a runaway preventing circuit of the PLL circuit is stopped to intentionally drive the oscillation circuit VCO to make runaway. When the DC level is supplied to the feedback clock signal CKF of the phase comparator PFD as explained above, since the phase comparator PDF continuously forms a phase comparison output to raise the oscillation frequency of VCO, the oscillation circuit VCO operates in the maximum oscillation frequency.

Here, the maximum frequency of oscillation circuit can be measured by comparing a count value of the reference clock signal CKR with a count value of the oscillation output of the oscillation circuit VCO within the same period. For example, the counting operations are started simultaneously under the condition that two counters are reset. When the count value of the reference clock signal CKR reaches the predetermined value, a count value of the oscillation output of the oscillation circuit VCO in this timing is fetched with the flip-flop circuit, for example, with the overflow (carry) signal of the counter and thereby it is then extracted serially via the test circuit BIST and input/output interface JTAG as in the case of the embodiment of FIG. 1. Measurement of the maximum frequency of such VCO is very important to know the performance of PLL.

Figure 3:
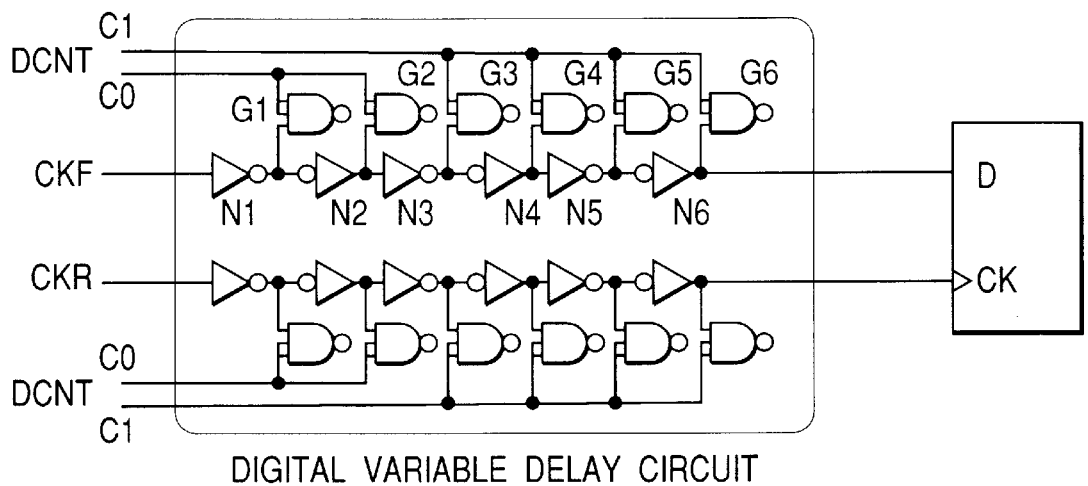
FIG. 3 is a block diagram showing the other embodiment of a measuring circuit provided in a semiconductor integrated circuit device of the present invention.

FIG. 3 shows a block diagram of another embodiment of a measuring circuit provided in the semiconductor integrated circuit device of the present invention. The measuring circuit of this embodiment automatically measures jitter of the feedback clock CKF for the reference clock signal CKR, namely deviation of phase for the time. This measuring circuit automatically measures the maximum time value between the maximum and minimum values of error between the reference clock signal CKR and feedback clock signal CKF, namely the time difference until fetch of edge becomes 0% to 100% defined as the pk—pk jitter and the time difference until fetch of edge becomes 16% to 84% defined as the RMS jitter.

In the measuring circuit of this embodiment, a digital variable delay circuit and flip-flop circuit are used. The digital variable delay circuit is composed of the inverter circuits N1 to N6 connected in serial and the gate circuits G1 to G6 as a variable capacitance means provided to the output terminals of the inverter circuits N1 to N6. One input of each gate circuit G1 to G6 is connected respectively to the output terminal of the corresponding inverter circuit N1 to N6. To the other input of the gate circuit G1 to G6, control signals C0, C1 are supplied. The control signals C0 and C1 are designated to have the weight of binary. The control signal C0 is supplied in common to the two gate circuits of the gate circuits G1 and G2. The control signal C1 is supplied in common to the four gate circuits of the gate circuits G3 to G6.

For example, the control signal C0 is destined to have the weight of $2^0$, while the control signal C1 the weight of $2^1$. The gate circuits G1 to G6 are respectively formed of the identical circuit structure. The gate circuits G1 to G6 close the gate when the control signals C0, C1 are in the low level (logic 0) and fixes the control signals C0, C1 to high level (logic 1) without response to the change of output signals of the corresponding inverter circuits N1 to N6. Therefore, when the control signals C0, C1 are in the low level, an input capacitance corresponding to one input terminal of the gate circuits G1 to G6 is connected as the capacitance load to the output terminals of the inverter circuits N1 to N6.

The gate circuits G1 to G6 open the gates when the control signals C0, C1 are high level (logic 1) to form the inverted signals in response to change of the output signals of the corresponding inverter circuits N1 to N6. Namely, when the output signals of inverter circuits N1 to N6 are changed to low level, the output signals of the gate circuits G1 to G6 are changed to high level and when the output signals of the inverter circuits N1 to N6 are changed to high level, the output signals of the gate circuits G1 to G6 are changed to low level. Therefore, at the output terminals of the inverter circuits N1 to N6, a load capacitance increases as much as increment of capacitance delta C due to the Miller capacitance of the gate circuits G1 to G6 and the delay time is increased as long as delta t.

When the control signals C0, C1 are in the low level, there is no capacitance increase of delta C at the gate circuits G1 to G6 in the inverter circuits N1 to N6. When the control signal C0 becomes high level and the control signal C1 becomes low level, capacitance increase of delta C×2 due to the Miller capacitance at the gate circuits G1 and G2 corresponding to the inverter circuits N1 to N2 is added. When the control signal C0 becomes low level and the control signal C1 becomes high level, capacitance increase of delta C×4 due to the Miller capacitance at the gate circuits G3 to G6 corresponding to the inverter circuits N3 to N6 is added. When both control signals C1 and C2 become high level, capacitance increase of delta C×6 due to the Miller capacitance at the gate circuits G1 to G6 corresponding to the inverters N1 to N6 is added. Namely, a ratio of the capacitance increase is set to four values such as 0, 1, 2, 3 corresponding to the binary control signals C0 and C1 and therefore the delay time can be changed in the four steps.

The digital variable delay circuit may be used for delaying the feedback clock signal CKF and the reference clock signal CKR is also delayed with the digital variable delay circuit of the same circuit configuration as that explained above. As a result, a delay time difference between the feedback clock signal CKF having passed the two digital variable delay circuits and the reference clock signal CKR corresponds to the capacitance increase delta C due to the Miller capacitance corresponding to the control signals C0 and C1 in the respective digital variable delay circuit. Therefore, the delay circuit can be protected from the influence of power supply change and temperature change or the like.

The feedback clock signal CKF delayed with two digital variable delay circuit and the reference clock signal CKR are supplied to the data terminal D and clock terminal CK of the flip-flop circuit for phase comparison. Namely, when the feedback clock signal CKF rises earlier than the rising edge of the reference clock signal CKR like the waveforms shown in FIG. 4, the flip-flop circuit fetches the logic 1. On the contrary, when the feedback clock signal CKF is delayed from the rising edge of the reference clock signal CKR, the flip-flop circuit fetches the logic 0.

For measurement of a single determination, for example, measurements as many times as 1024 times are conducted repeatedly. FIG. 5 shows a relationship between the degree and histogram in a single determination and a delay time of the digital variable delay circuit. When the feedback clock signal CKF is leading to the reference clock signal CKR more than the jitter of the feedback clock signal CKF with the digital variable delay circuit as in the case (1) of FIG. 4 and FIG. 5, the logic 1 of all measurements of 1024 times is fetched. When the feedback clock signal CKF is leading to the reference clock signal CKR as much as about the jitter of the feedback clock signal CKF with the digital variable delay circuit as in the case (2) of FIG. 4 and FIG. 5, minor logic 1 and major logic 1 among the measurements of 1024 times are mixed.

Figure 4:
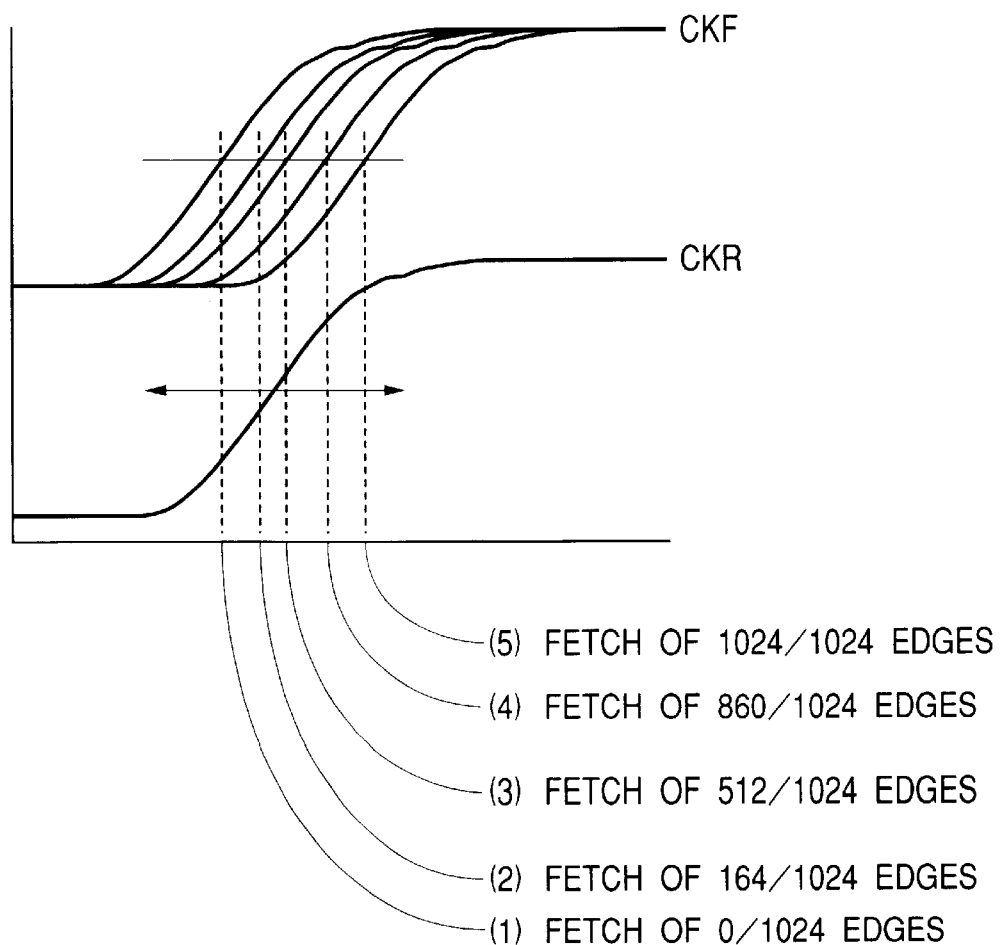
FIG. 4 is a waveform diagram of a feedback clock signal CKF and a reference clock signal CKR for explaining the measuring circuit of FIG. 3.
Figure 5:
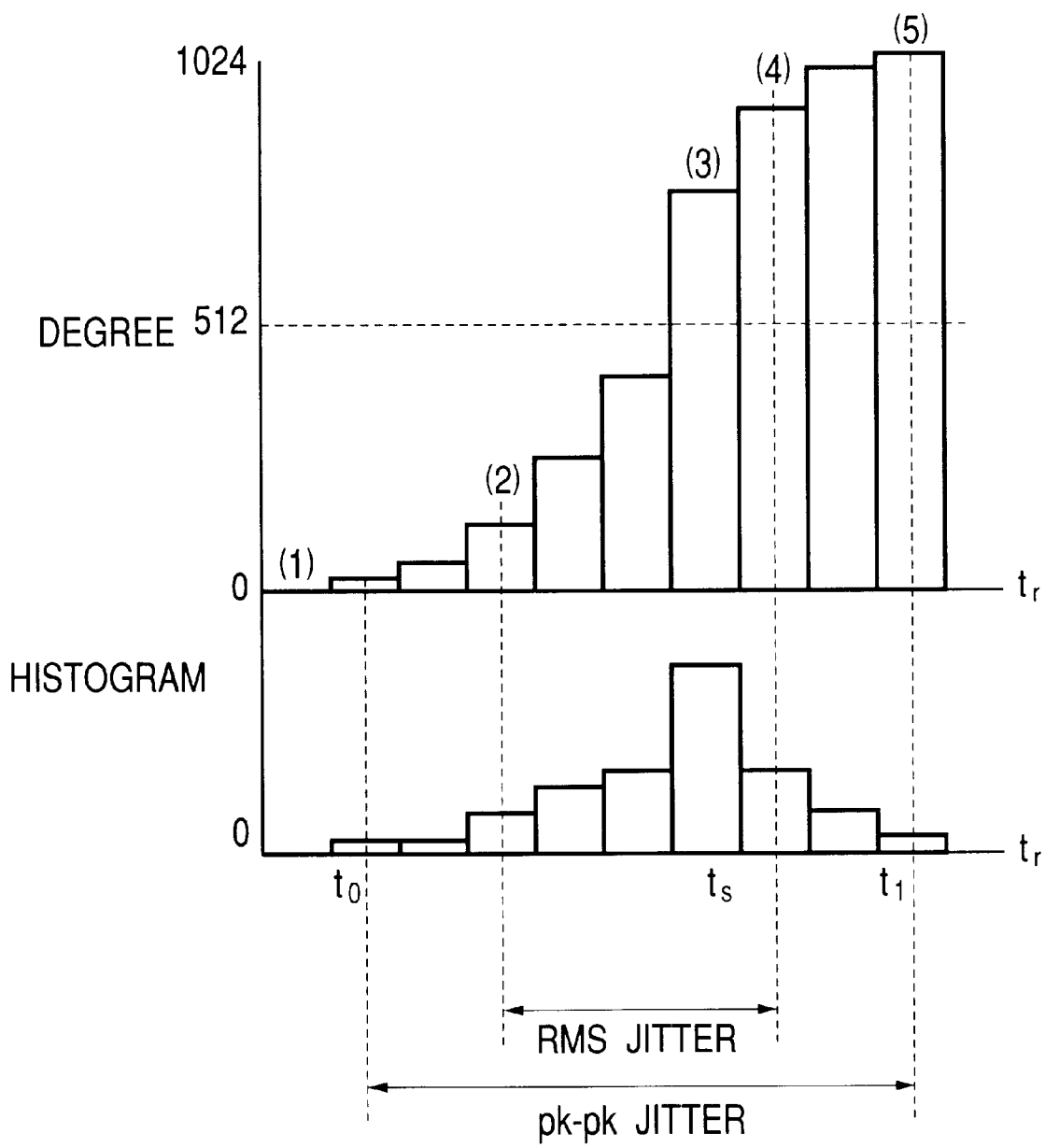
FIG. 5 is a diagram f or explaining the relationship between degree and histogram in single determination of the measuring circuit of FIG. 3 and delay time of a digital variable delay circuit.

When a delay difference due to the digital variable delay circuit of the feedback clock signal CKF and reference clock signal CKR is reduced to zero as in the case (3) of FIG. 4 and FIG. 5, the logic 0 and logic 1 among the measurements of 1024 times are respectively fetched in the equal half. When the feedback clock signal CKF is delayed from the reference clock signal CKR as much as about the jitter of the feedback clock signal CKF with the digital variable delay circuit as in the case (4) of FIG. 4 and FIG. 5, major logic 0 and minor logic 1 among the measurements of 1024 times are mixed. When the feedback clock signal CKF is delayed from the reference clock signal CKR as much about jitter of the feedback clock signal CKF with the digital variable delay circuit as in the case (1) of FIG. 4 and FIG. 5, the logic 0 is fetched for all measurements of 1024 times.

On the contrary, the cases (1), (2) and cases (3), (4) are searched through combination of the control signals C0, C1 supplied to the digital variable delay circuit. Therefore, the digital variable delay circuit has only four kinds of delay times but actually it can also have many delay times of eight or 16 kinds or the like by increasing the control signals having the binary weight up to three and four kinds or the like.

A time difference of the cases (1) and (5) is determined as pk—pk jitter. In the same manner, a time difference between the delay time when the logic 0 is fetched up to about 16% of the entire part as in the case (2) and the delay time when the logic 0 is fetched up to about 84% of the entire part as in the case (4) is determined as the RSM jitter.

Figure 6:
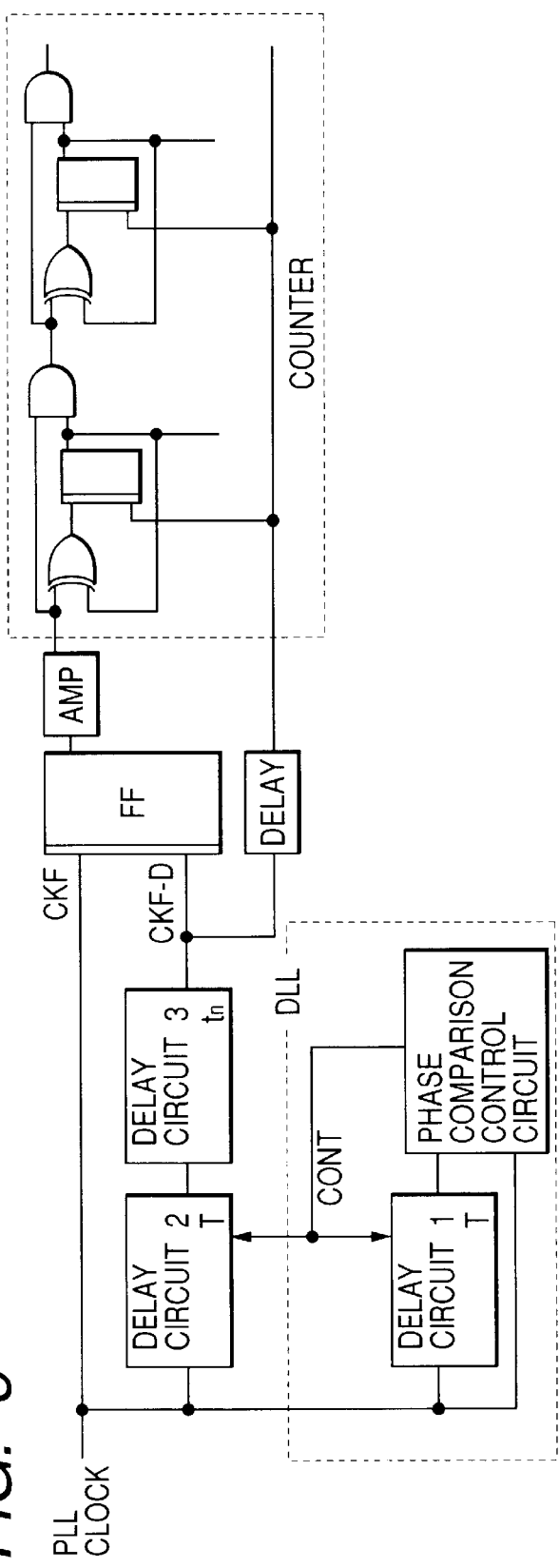
FIG. 6 is a block diagram showing the other embodiment of a measuring circuit provided in a semiconductor integrated circuit device of the present invention.

FIG. 6 shows a block diagram of another embodiment of a measuring circuit provided in the semiconductor integrated circuit device of the present invention. The measuring circuit of this embodiment automatically measures the cycle (period) jitter of the feedback clock CKF formed in the PLL circuit, namely time fluctuation of the internal clock. In this measuring circuit, a delayed signal delayed by one period is formed for the PLL clock (feedback clock signal CKF) using the DLL circuit. The DLL circuit supplies the PLL clock to the delay circuit and compares the delayed signal delayed by the time T with the PLL clock with the phase comparison control circuit to attain the matching of these signals, namely forms a control signal CONT in which the delay time T in the delay circuit 1 corresponds to the one period of the PLL clock.

Figure 7:
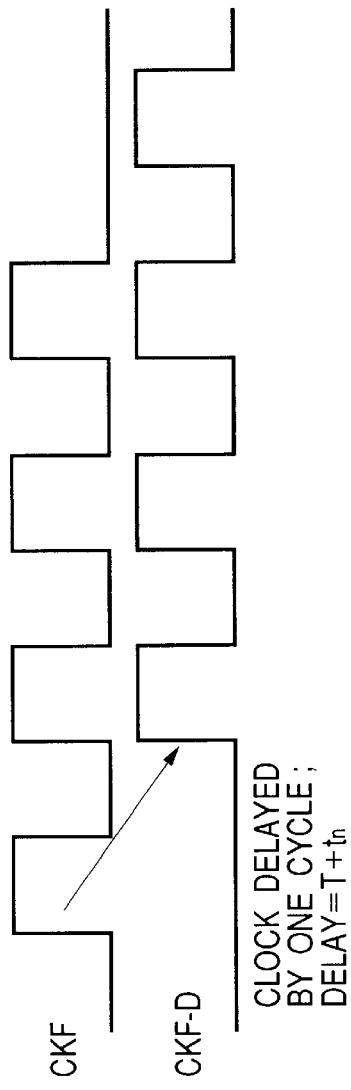
FIG. 7 is a waveform diagram for explaining operations of the measuring circuit of FIG. 6.

Using the control signal CONT in the DLL circuit, the PLL clock is delayed with the delay circuit 2 same as the delay circuit 1. Thereby, a delay signal corresponding to one period T of the PLL clock is formed with the delay circuit 2. The signal delayed by one period is also delayed with the delay circuit 3. This delay circuit 3 corresponds to the digital variable delay circuit of FIG. 3 which realizes fine adjustment of delay time. Thereby, the signal CKF-D is delayed by about one period such as the T+tn as shown in FIG. 7 for the CKF.

The PLL clock (feedback clock signal CKF) and the delayed signal CKF-D which is delayed by about one period through the delay circuits 1 and 3 are respectively supplied to the data terminal and clock terminal of the flip-flop circuit FF of FIG. 3 for the purpose of phase comparison. Namely, as explained above, when feedback clock signal CKF rises earlier than the rising edge of the delayed signal CKF-D that is delayed by one period, the flip-flop circuit fetches the logic 1. On the contrary, when the feedback clock signal CKF is delayed from the rising edge of the delayed signal CKF-D that is delayed by one period, the flip-flop circuit fetches the logic 0.

An output signal of the flip-flop circuit FF is amplified, although not particularly restricted, with an amplifying circuit AMP and is then supplied to a counter circuit. The counter circuit operates with the clock signal obtained by delaying the delayed signal CKF-D with the delay circuit delay and counts up the logic 0 that is fetched with the flop-flop circuit FF. That is, the counter circuit is operated by delaying the clock signal CKF-D of the flip-flop circuit FF with the delay circuit delay, considering the phase comparison operation in the flip-flop circuit FF and the signal delay in the amplifying circuit.

The phase comparison operation itself is similar to that in the embodiment of FIG. 3 and a value of phase deviation is measured from the clock signal CKF-D delayed by one period, in place of the reference clock signal CKR, namely from the clock signal CKF-D before one cycle.

Figure 8:
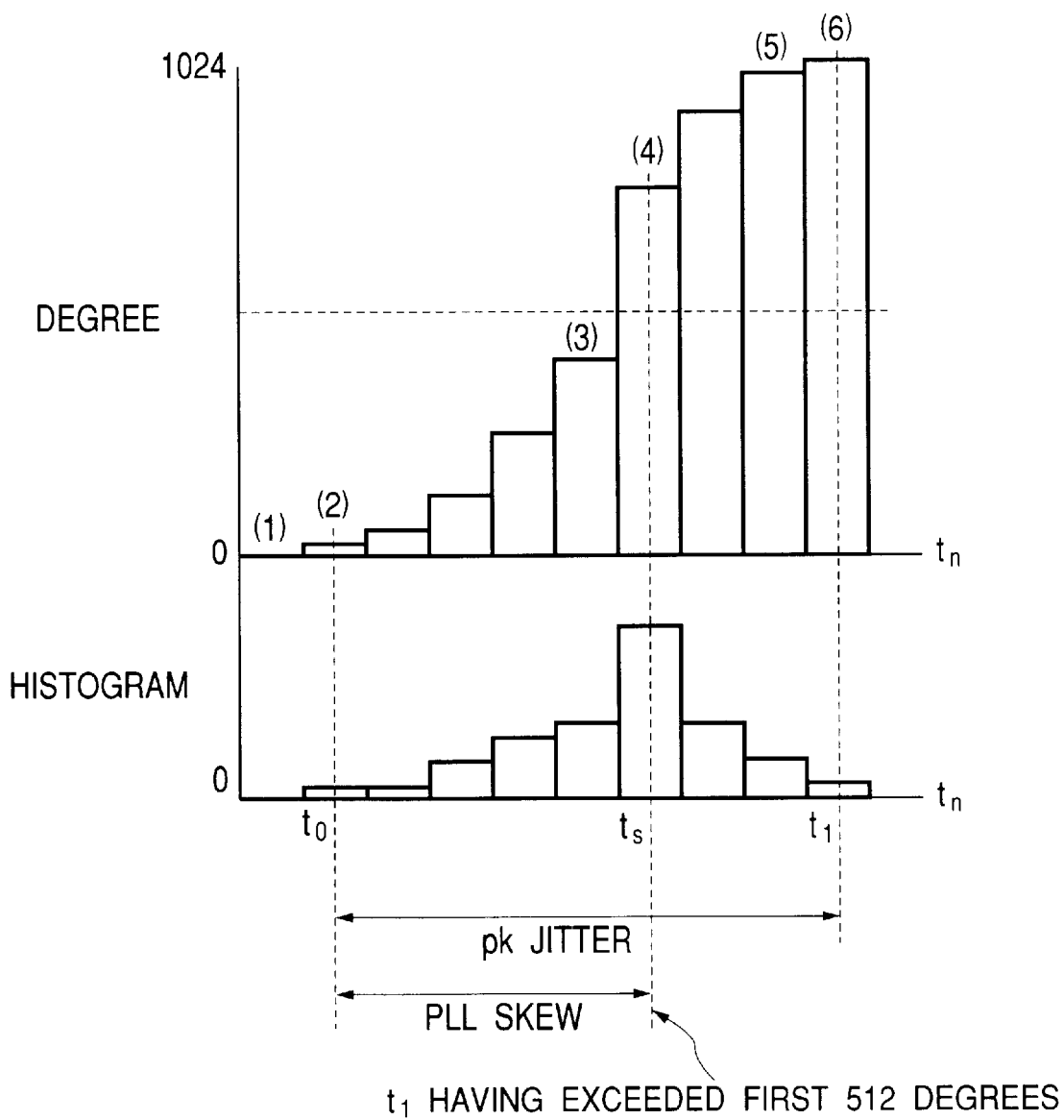
FIG. 8 is a diagram for explaining relationship between degree and histogram in single determination and delay time tn.

Many measurements such as 1024 times are repeated, for example, for the measurement of a single determination. FIG. 8 shows the relationship between the degree, histogram and the delay time tn in the delay circuit 3 in a single determination. As in the case (1) of FIG. 8, the logic 0 is fetched entire for the measurements of 1024 times when the delay signal CKF-D is set earlier than the jitter in comparison with the feedback clock signal CKF after one cycle. When the delayed signal CKF-D is set earlier about the jitter of the feedback clock signal CKF in comparison with the feedback clock signal CKF after one cycle as in the case (2) of FIG. 8, the minor logic 0 and major logic 1 are mixed among the measurements of 1024 times. When a delay difference between the delayed signal CKF-D and the feedback clock signal CKF is set to zero as in the case of (3) and (4) of FIG. 8, the logic 0 and logic 1 are fetched to a half respectively among the measurements of 1024 times. When the delayed signal CKF-D is delayed as much as the jitter of the feedback clock signal CKF in comparison with the feedback clock CKF after one cycle as in the case of (5) of FIG. 8, major logic 0 and minor logic 1 are mixed among the measurements of 1024 times. When the delayed signal CKF-D is delayed as much as jitter or more of the feedback clock signal CKF in comparison with the feedback clock signal CKF after one cycle, only the logic 0 is fetched completely among the measurements of 1024 times.

When the PLL circuit is synchronized, a difference between total earlier and delay element from the target oscillation frequency becomes ±0. Therefore, when the logic 1 and logic 0 become almost 50% respectively (count value is 512), the target oscillation frequency can be obtained. With this measurement, the minimum cycle (minimum period) can be obtained as a delay difference of (4)–(1) and the maximum cycle (maximum period) is obtained as a delay difference of (6)–(4).

Figure 10:
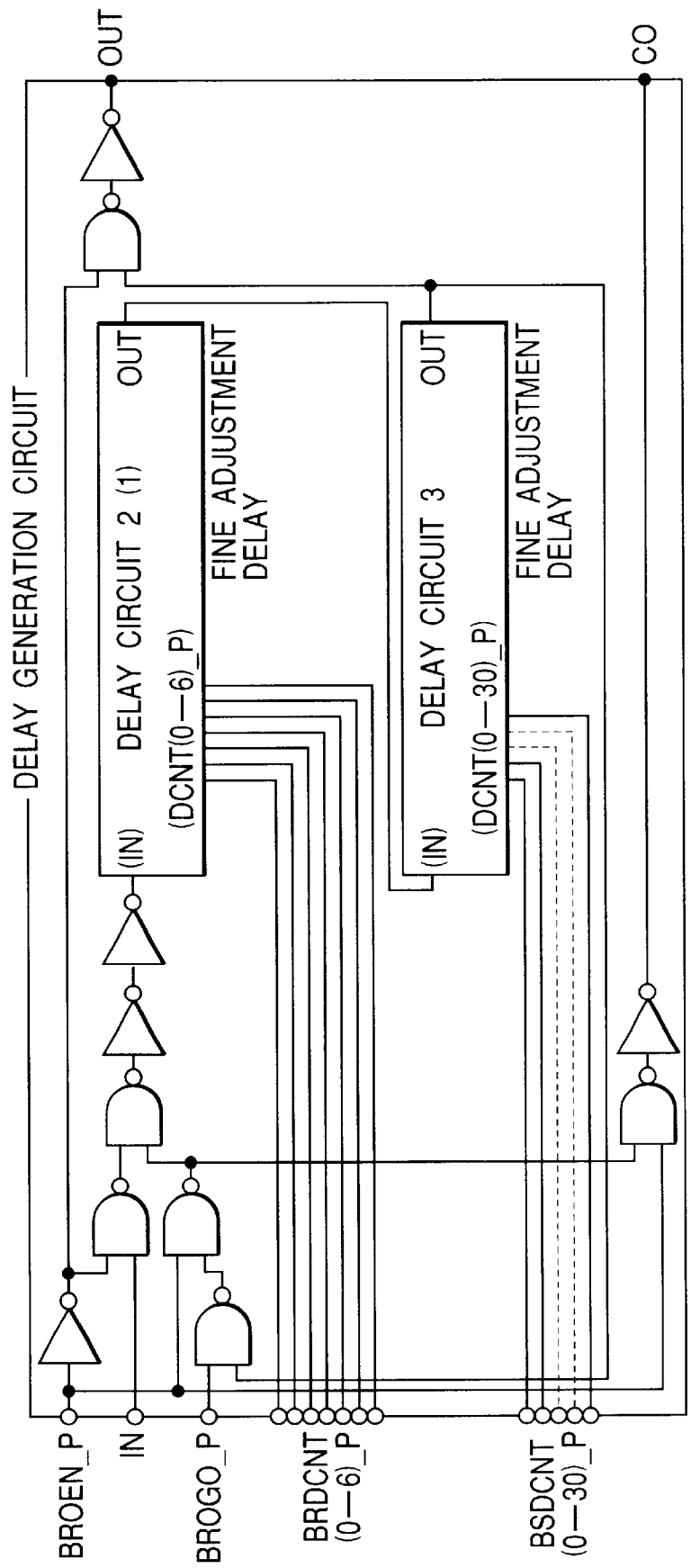
FIG. 10 is a block diagram showing an embodiment of a delay generating circuit of the embodiment of FIG. 6.

FIG. 10 shows a block diagram of an embodiment of the delay generating circuit of the embodiment FIG. 6. The delay circuit 2 and delay circuit 1 are formed of the identical circuit and the control signal BRDCNT (0–6)_P supplied to the delay circuit 2 is generated with the delay circuit 1 forming the DLL circuit. The output terminal OUT of this delay circuit 2 is connected to the input terminal IN of the delay circuit 3 and the output terminal OUT of the delay circuit 3 is selectively transferred to the output terminal OUT of the delay generating circuit through the gate circuit.

Figure 11:
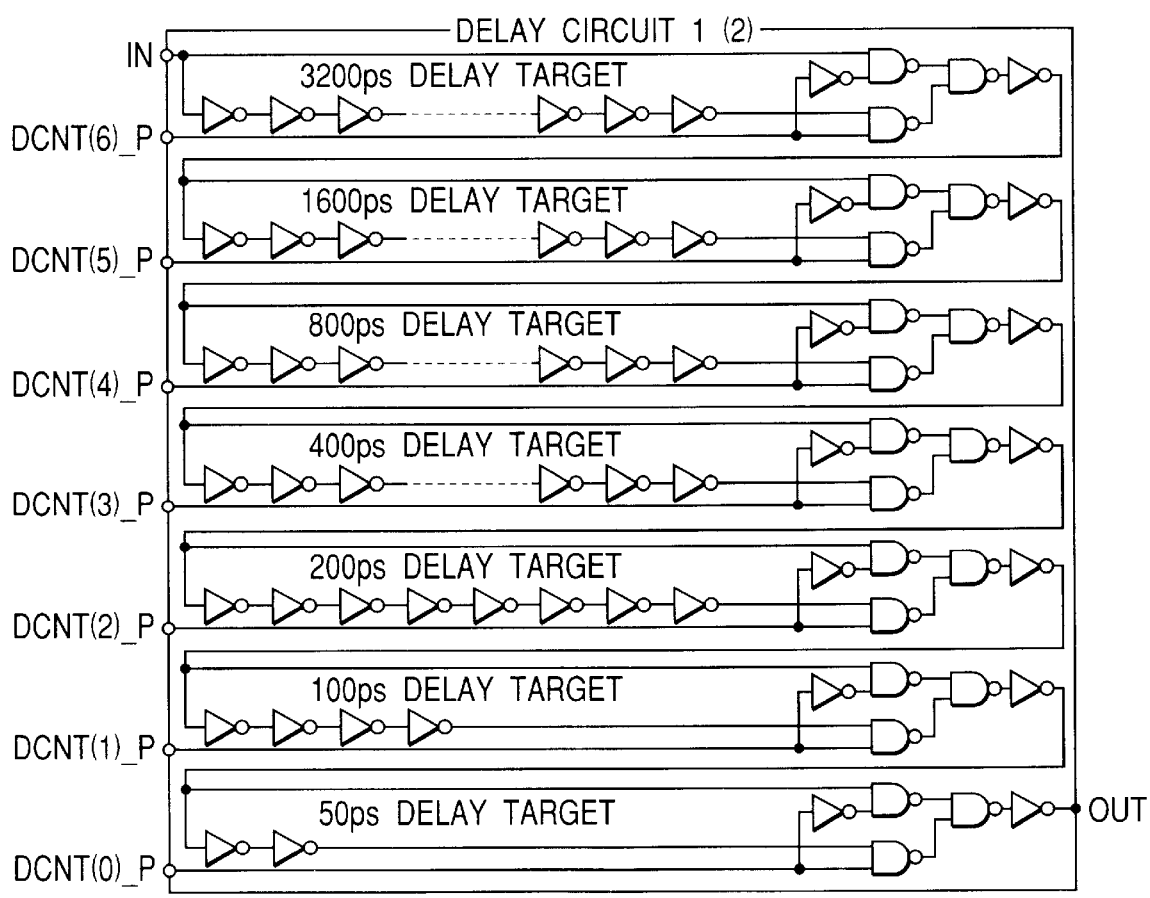
FIG. 11 is a circuit diagram showing an embodiment of a delay circuit of FIG. 10.

FIG. 11 shows a circuit diagram of an embodiment of the delay circuit 1 (2) of FIG. 10. In this embodiment, the seven delay circuits are provided and are cascade-connected corresponding to the control signals DCNT(0)_P to DCNT(0)_P of seven (7) bits. In each delay circuit, the delay time is assigned, with reference to the delay target of 50 ps, in the ratio corresponding to the weight of binary such as 2 times (100 ps delay target), 4 times (200 ps delay target), 8 times (400 ps delay target), 16 times (800 ps delay target), 32 times (1600 ps delay target) and 64 times (3200 ps delay target).

Each delay time is determined depending on the number of inverter circuits connected in series. When the delay time in one inverter circuit is defined as 25 ps, the inverter circuits corresponding to the delay target are connected in serial. For these serial inverter circuits, a signal route for bypassing the signal is also provided. The delay times corresponding to $2^0$ to $2^6$ are selected for the control signals DCNT(0)_P to DCNT(0)_P depending on the selection of the bypass route or selection of the inverter circuit train.

Figure 12:
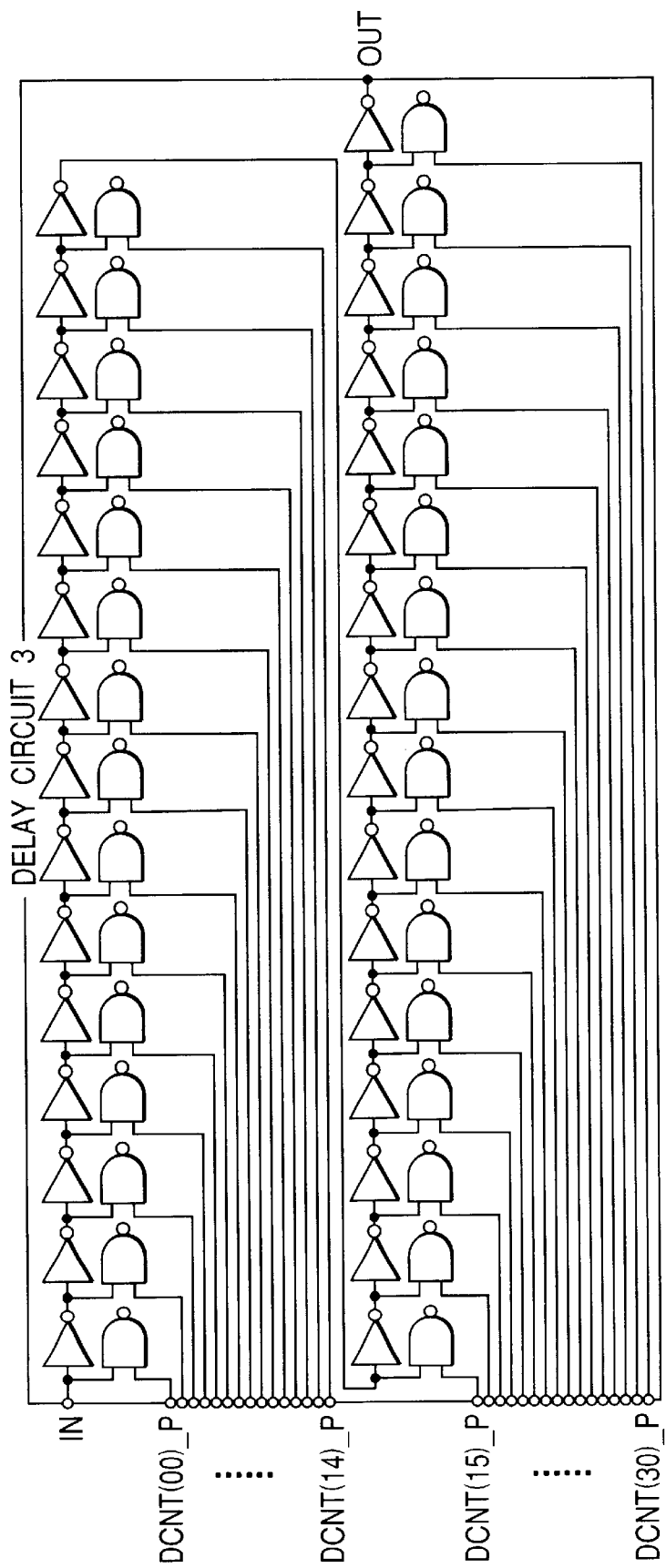
FIG. 12 is a circuit diagram showing an embodiment of a delay circuit of FIG. 10.

FIG. 12 shows a circuit diagram of an embodiment of the delay circuit 3 of FIG. 10. In this embodiment, like the embodiment of FIG. 3 and FIG. 9, the circuit is structured with combination of the inverter circuit and the gate circuit working as the variable capacitance provided at the output terminal of this inverter circuit. Here, setting of fine delay time can be made in 30 ways with the control signals DCNT(00)_P to DCNT(30) supplied to the gate circuit.

Figure 13A:
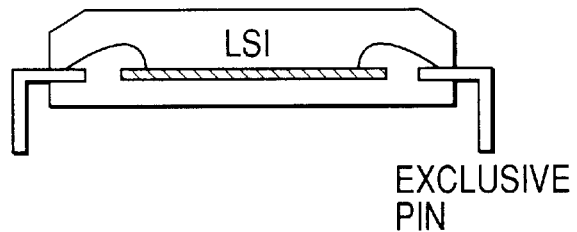
FIGS. 13A and 13B are schematic cross-sectional views showing an embodiment of the semiconductor integrated circuit device of the present invention.
Figure 13B:
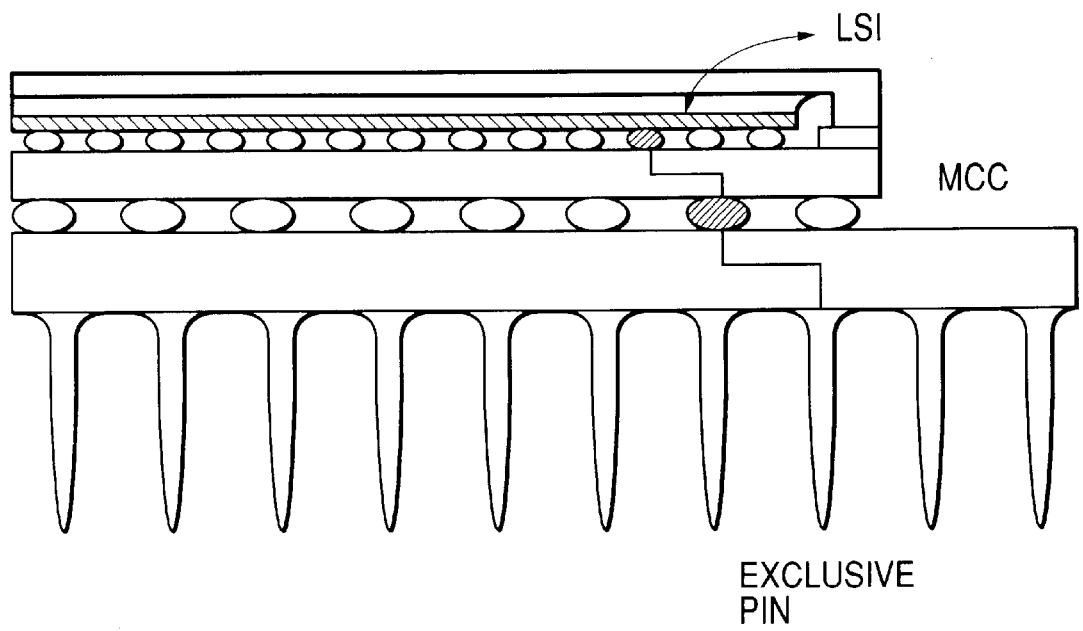

FIGS. 13A and 13B show a schematic cross-sectional view of an embodiment of the semiconductor integrated circuit device of the present invention. The test pins are provided for the semiconductor integrated circuit device LSI respectively in the resin PKG (package) (A) and ceramic PKG (package) (B). This test pins correspond, although not particularly restricted, to the interface circuit JTAG of the test circuit BIST which will be explained later.

The test terminals output the result measured with the measuring circuit included in the test circuit BIST. For the PLL circuit operating in the frequency as high as 500 MHz or more as explained above, the result of measurement in the frequency as low as several MHz to 100 MHz an be outputted, not depending on the profile of the resin PKG (A) and ceramic PDG (B). When such test terminals are provided, even if a semiconductor integrated circuit device is built into the board, various performances of the PLL circuit can be measured via the test circuit BIST.

Figure 14:
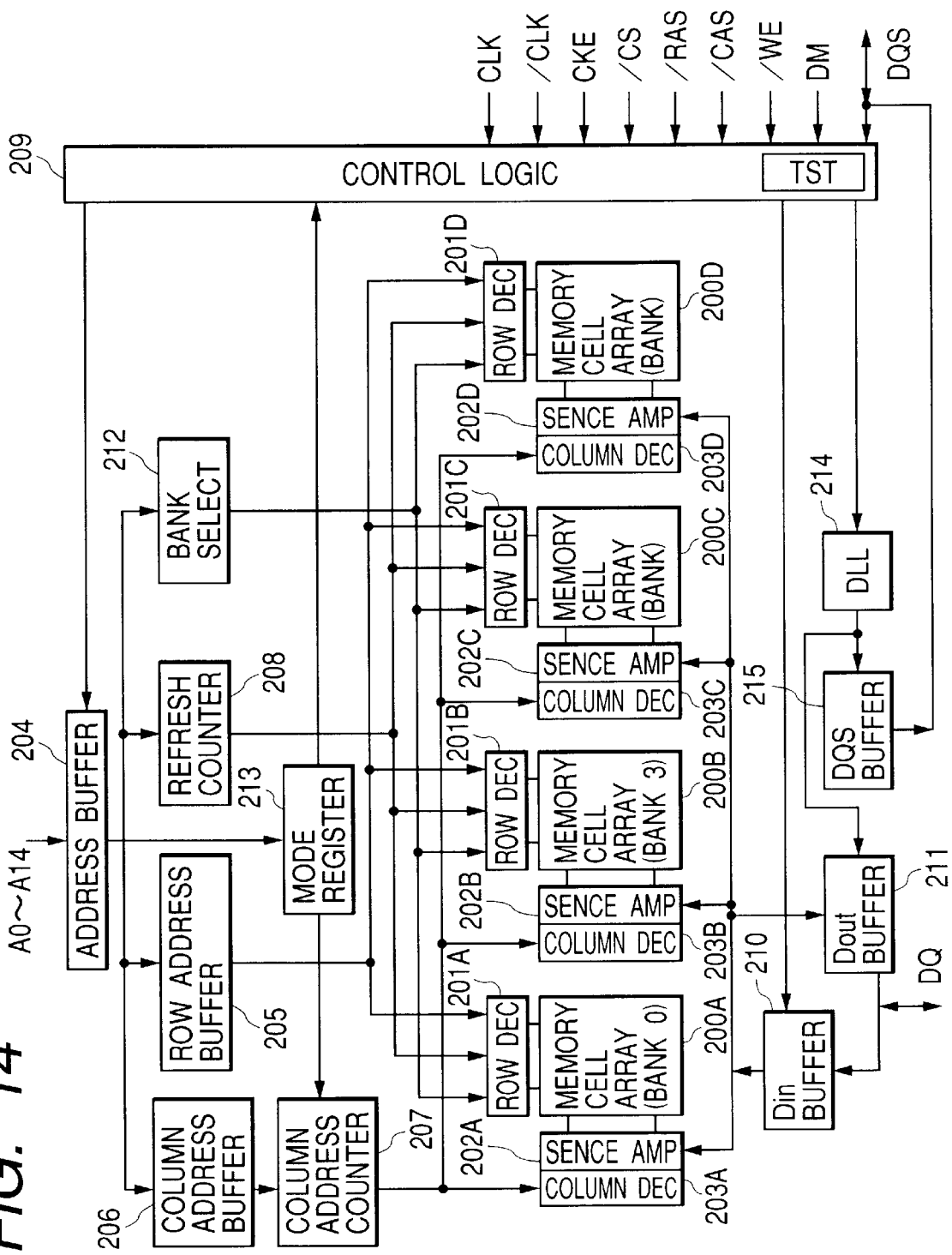
FIG. 14 is a total block diagram showing an embodiment of the synchronous DRAM to which the present invention is applied.

FIG. 14 shows a total block diagram of an embodiment of the DDR SDRAM (Double Data Rate Synchronous Dynamic Random Access Memory) to which the present invention is applied. The DDR SDRAM of this embodiment is provided, although not particularly restricted, as the four memory arrays 200A to 200D corresponding to the four memory banks. The memory arrays 200A to 200D corresponding to the four memory banks 0 to 3 are provided with the matrix type dynamic memory cell, the selection terminals of memory cells allocated in a line are coupled with the word line (not shown) of each column and the data input/output terminals of memory cells allocated in the same row are coupled with the complementary data line (not shown).

Only one of the word lines not shown of the memory array 200A is driven to the selection level depending on the result of decoding of the row address signal with the row decoder (Row DEC) 201A. The complementary data line of the memory array 200A is coupled with the I/O lines of the sense amplifier (Sense AMP) 202A and column selection circuit (Column DEC) 203A. The sense amplifier 202A amplifies a detected fine voltage difference appearing on the respectively complementary data lines by reading data from the memory cell. The column selection circuit 203A includes a switch circuit for selecting each complementary data line and connecting it to the complementary I/O line. The column switch circuit performs the selective operation depending on the result of decoding of the column address signal with the column decoder 203A.

The memory arrays 200B to 200D are also provided with the row decoders 201B to D, sense amplifiers 203B to D and column selection circuits 203B to D. The complementary I/O lines are used in common for each memory bank and are connected to the output terminals of the data input circuit (Din Buffer) 210 having the write buffer and the input terminals of the data output circuit (Dout Buffer) 211 including the main amplifier. The terminal DQ is used, although not particularly restricted, as the data input/output terminal for inputting and outputting the data D0 to D15 consisting of 16 bits. The DQS buffer 215 forms a data strobe signal of the data outputted from the terminal DQ.

The address signals A0 to A14 supplied from the address input terminal is once held in the address buffer 204, while the row address signal among the address signals inputted on the time axis basis is held in the row address buffer 205 and the column address signal is held in the column address buffer 206. A refresh counter 208 generates a row address for the automatic refresh and self refresh mode.

For example, when the memory capacity is as large as 256 Mbits, if the column address signal is used for memory access in unit of 2 bits, the address terminal is provided for inputting the address signal A14. In the ×4-bit structure, the signals up to the address signal A11 are validated, while in the ×8-bit structure, the signals up to the address signal A10 are validated and in the ×16-bit structure, the signals up to the address signal A9 are validated. When the memory capacity is 64 Mbits, in the ×4-bit structure, the signals up to the address signal A10 are validated, in the ×8-bit structure, the signals up to the address signal A9 are validated, and in the ×16-bit structure, the signals up to the address signal A8 are validated.

An output of the column address buffer 206 is supplied as the preset data of the column address counter 207 and the column address counter 207 outputs, in the burst mode designated with a command explained later, the column address signal as the preset data and a value obtained with sequential increment of such column address signal to the column decoders 203A to 203D.

A mode register 213 holds various operation mode information pieces. In regard to the row decoders 201A to 201D, only the decoders corresponding to the bank designated with the bank select circuit 212 operate for the selective operation of the word line. A control circuit (control logic) 209 is fed, although not particularly restricted, with an external control signals such as the clock signal CLK, /CLK (the signal given the sign / is a low enable signal), clock enable signal CKE, chip select signal ICS, column address strobe signal /CAS, row address strobe signal /RAS and write enable signal /WE and an address signal supplied via DM, DQS and mode register and forms an internal timing signal to control the operation mode and test mode of DDR SDRAM and operations of the above circuit block based on the level change and timing of these signals. Therefore, the control circuit 209 is provided with the input buffers corresponding to respective signals. Moreover, this control circuit 209 is also provided with a measuring circuit (TST) to conduct the measuring operation (except for the lock time and the maximum oscillation frequency) for the DLL circuit explained later.

The clock signals CLK and /CLK are inputted to the DLL circuit 214 via a clock buffer to generate an internal clock. The internal clock is used, although not particularly restricted, as an input signal of the data output circuit 211 and DQS buffer 215. Moreover, the clock signal supplied via the clock buffer is then supplied to the data input circuit 210 and the clock terminal connected to the address counter 207.

The other external input signals are set as the significant signals in synchronization with the rising edge of the relevant internal clock signal. The chip select signal ICS instructs the start of command input cycle with its low level. When the chip select signal /CS is high level (chip non-conducting condition), this signal is not significant and the other inputs are also not significant. However, the selecting condition of the memory bank and internal operation such as the burst operation are not influenced with the change to the chip non-selecting condition. The signals /RAS, /CAS and /WE are different in the functions from the corresponding signals in the ordinary DRAM and are assumed as the significant signals for defining the command cycle explained later.

The clock enable signal CKE indicates validity of the next clock signal. When the signal CEK is high level, the rising edge of the next clock signal CLK is validated and invalidated when the signal CEK is low level. In the read mode, when an external control signal /OE for controlling output enable for the data output circuit 211 is used, this signal /OE is also supplied to the control circuit 209 and when this signal is, for example, high level, the data output circuit 211 is set to the high output impedance.

The row address signal explained above is defined with the level of A0 to A11 in the row address strobe•bank active command cycle explained later synchronized with the rising edge of the clock signal (internal clock signal).

The address signals A12 and A13 are assumed as the bank selection signals in the row address strobe•bank active command cycle. Namely, only one among four memory banks 0 to 3 is selected through selection of the address signals A12 and A13. The selection control of memory bank can be realized, although not particularly restricted, with the processes such as activation of only the row decoder in the selected memory bank side, total non-selection of the column switch circuit in the non-selected memory bank side and connection of only the selected memory bank side to the data input circuit 210 and data output circuit.

The column address signal is defined, in the case of ×16-bit structure for 256 Mbits, with the level of the A0 to A9 in the read or write (column address•read command, column address•write command) cycle synchronized with the rising edge of the clock signal CLK (internal clock). The column address defined as explained above is used as the start address of burst access.

In the DDR SDRAM, when the burst operation is performed in one memory bank, another memory bank is designated in the course of such burst operation. When the row address strobes•bank active command is supplied, operation in relation to the row address is performed in the relevant memory bank without resulting in any influence on the operation executed in one memory bank.

The read operation of the DDR SDRAM is conducted as follows. Each signal of chip select /CS, /RAS, /CAS and write enable /WE is inputted in synchronization with the CLK signal. The row address and bank selection signal are inputted simultaneously when /RAS=0 and are then held respectively in the row address buffer 205 and bank selection circuit 212. The row decoder 210 of the bank designated with the bank selection circuit 212 decodes the row address signal to output the data of all rows from the memory cell array 200 as a fine signal. The fine signal outputted is amplified and held with the sense amplifier 202. The designated bank becomes active.

After three clock signals CLK from the row address input, the row address and bank selection signal are inputted simultaneously when CAS=0 and are then held respectively with the column address buffer 206 and bank selection circuit 212. When the designated bank is active, the column address being held is outputted from the column address counter 207 and the column decoder 203 selects the column. The selected data is then outputted from the sense amplifier 202. In this case, two sets of data are outputted (8 bits in the ×4-bit structure, 32 bits in the ×16-bit structure).

The data outputted from the sense amplifier 202 is then outputted to the outside of chip from the data output circuit 211. The output timing is synchronized with both rising and falling edges of the QCLK outputted from the DLL 214. In this case, as explained above, two sets of data are converted to the serial data from parallel data to become the data of one set ×2. Simultaneously with data output, the data strobe signal DQS is outputted from the DQS buffer 215. When the length of burst stored in the mode register 213 is 4 or more, the column address counter 207 increments automatically the address to read the next column data.

It is a role of the DLL214 to generate the operation clock QCLK of the data output circuit 211 and DQS buffer 215. The data output circuit 211 and DQS buffer 215 actually output the data signal and data strobe signal after a certain period of time from the input of the internal clock QCLK generated in the DLL214. Therefore, the phases of the data signal and data strobe signal are matched with the external clock CLK by making earlier the phase of the internal clock signal QCLK more than the external CLK using a replica circuit. Accordingly, in this case, the data signal and data strobe signal explained above are matched in the phase with the external clock signal.

Figure 15:
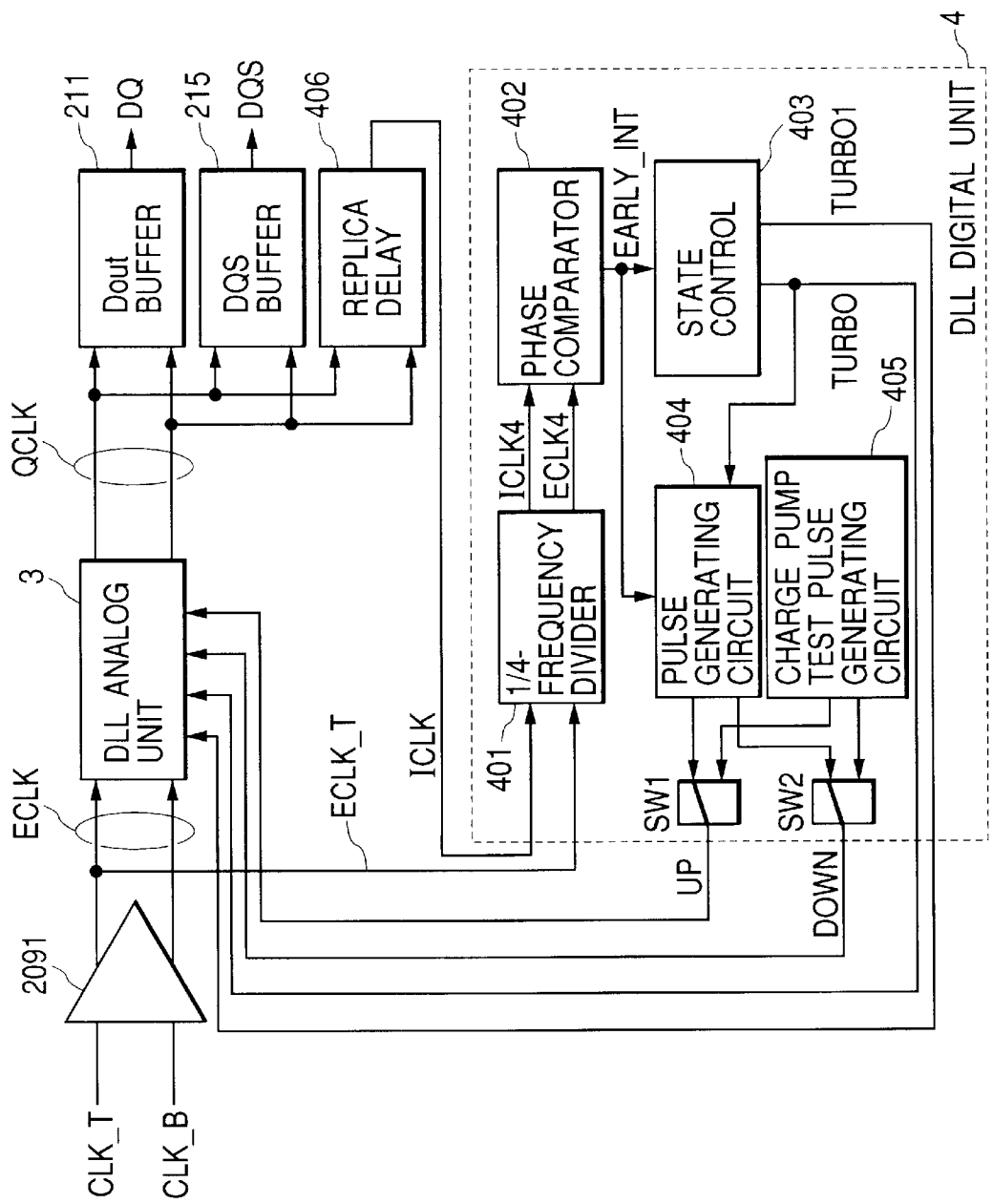
FIG. 15 is a total block diagram showing an embodiment of the DLL of FIG. 14.

FIG. 15 shows a total block diagram of an embodiment of the DLL circuit of FIG. 14. In this figure, the total diagram of the DLL focusing on the DLL digital unit 4 is illustrated. The DLL digital unit controls the DLL analog unit 3 to set the external clock signal CLK_T inputted via the clock input circuit 2091 and the internal clock signal ICLK to the in-phase condition.

In the DLL circuit of this embodiment, the external clock signal CLK_T and internal clock signal ICLK are divided into ¼ in the frequency with a frequency dividing circuit 401 in order to prevent harmonic lock. The phase of the ECLK4 divided to ¼ from the external clock signal ECLK_T is compared with the phase of the ICLK4 divided to ¼ from the internal clock signal ICLK with the phase comparator 402. A state control circuit 403 outputs the TURBO and TURBO signals from the EARLY_INT as a result of the phase comparison. A pulse generating circuit 404 outputs an UP signal and a DOWN signal to control the operation of a charge pump provided in the DLL analog unit 3.

In this embodiment, a charge pump test pulse generating circuit 405 is provided. The CP_PULSE signal outputted from this circuit controls, in place of the UP and DOWN signals, operations of the charge pump provided in the DLL analog unit 3 for testing this operation. The DLL analog unit 3 is an analog variable delay circuit structured with a variable delay circuit in which the operation current of a MOS differential amplifying circuit to receive the complementary signals (T and B) is controlled and the delay time is analogously varied in response to change of the operation current.

The frequency dividing circuit 401 is fed with the clock signal CLK_T via the clock input circuit 2091 and the internal clock signal ICLK via the replica (replica delay) 406. As a result, the ECLK and ICLK4 which are respectively divided to ¼ in the frequency are compared in the phases with the phase comparator 402. The replica circuit 406 is a delay circuit composed of the clock input circuit 2091 and the circuit same as the data output circuit 211 or DQS buffer (output circuit) 215. Thereby, since the DLL analog unit 3 generates the internal clock signal QCLK of the phase leading as much as the clock input circuit 2091 and data output circuit 211 (or DQS buffer 215), the external clock signal CLK_T is set to the same phase, for example, as the data signal via the data output circuit 211 or the clock signal outputted through the DQS buffer 215.

Figure 16:
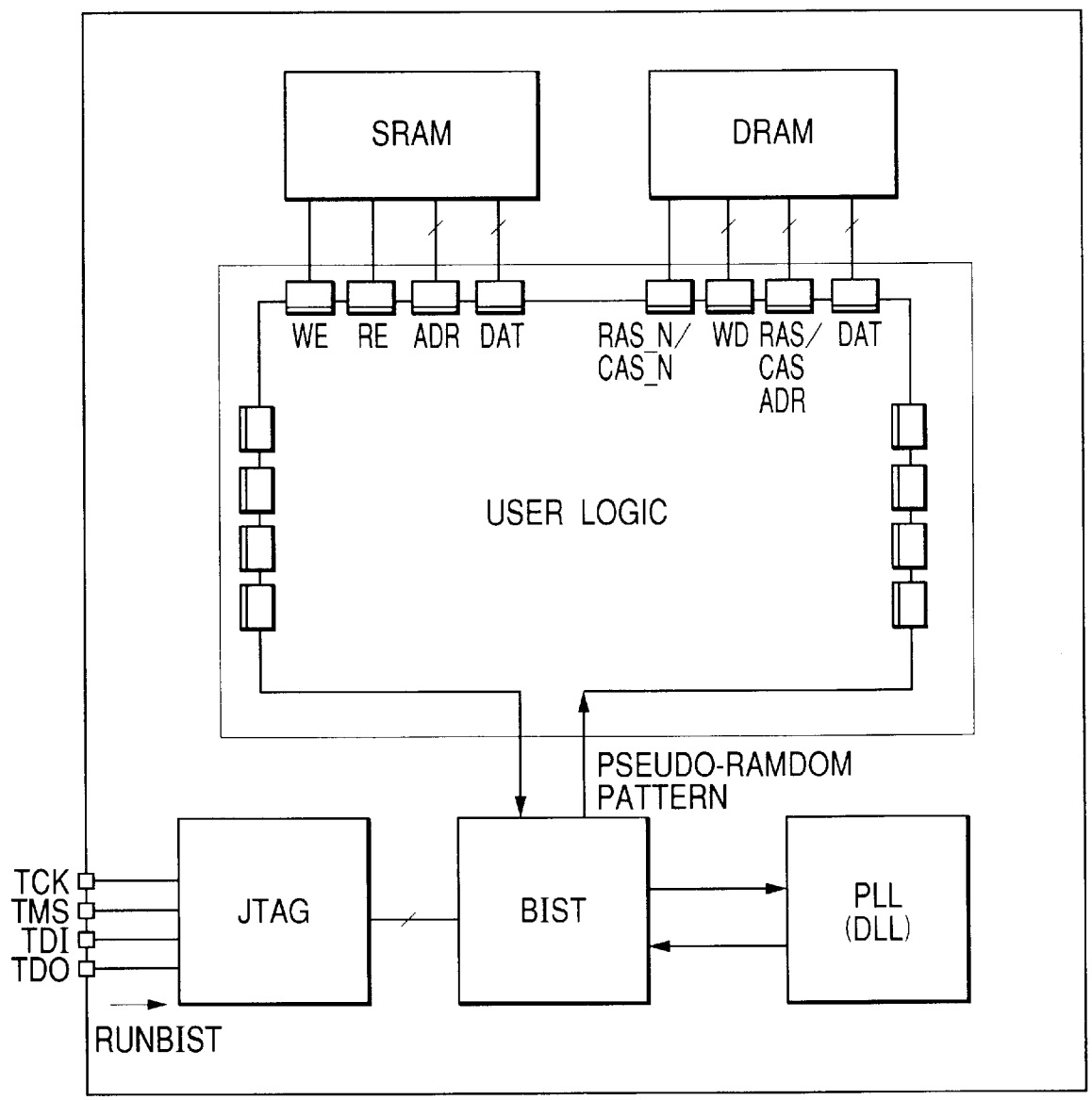
FIG. 16 is a block diagram showing another embodiment of the semiconductor integrated circuit device of the present invention.

FIG. 16 shows a block diagram of another embodiment of the semiconductor integrated circuit device of the present invention. The semiconductor integrated circuit device of this embodiment is composed, although not particularly restricted, of the DRAM (dynamic RAM), SRAM (static RAM), user logic for controlling these RAM, test circuit BIST and interface circuit JTAG. The interface circuit JATG is synchronized with the clock terminal TCK to serially input and output the mode setting signal TMS, test input data TDI and test output data TDO.

The DRAM is provided with a DRAM core having the memory capacity, for example, as large as 64 K words× 288words (about 18.4 M bits), four registers having the memory capacity of 72 bits for data writing to the DRAM and four registers having the memory capacity of 72 bits for data reading. The SRAM has a role as a buffer register for input and output operations and is provided with four write ports of 128 words×72 bits and four read ports of 128 words×72 bits. A user logic is composed of an input/output interface for input and output in unit of 72 bits and a multiplexer or the like to transfer the data of 72 bits between the SRAM and DRAM explained above.

The test circuit BIST includes a measuring circuit of the PLL circuit (or DLL circuit) explained above and supplies serially a test pattern to the latch circuits which are chained to form a register in the measuring circuit and user logic to urge the latch circuits to output in parallel the signal to instruct the operations to the measuring circuit, user logic, DRAM and SRAM. Thereby, the DRAM, SRAM, user logic and measuring circuit operate the internal circuits thereof with the signal supplied from the test circuit BIST.

As a result, an input signal is supplied even in the burn-in condition with the other system for the ordinary operation signals of DRAM and SRAM. In this case, since the signal routes for ordinary operation and burn-in condition are not connected in direct, the burn-in operation can be performed without giving influence on the signal transfer rate during the ordinary operation. In the same manner, various measuring operations for the PLL circuit (or DLL circuit) can be executed for the measuring circuit. In the DLL circuit, since the VCO does not exist, measurement for lock time and maximum frequency is not executed. As explained above, the test circuit BIST is urged to execute the operation test of various flop-flop circuits and counter circuit by assuming the measuring circuit as a part of the user logic. Thereby, it is possible for the measuring circuit to have the self-diagnostic function.

The operations and effects obtained from the above embodiment are as follows.

(1) The semiconductor integrated circuit device comprising a clock generating circuit to form the internal clock signal corresponding to the input clock signal inputted from an external terminal can provide the effect that the performance of PLL circuit up to the higher frequency can be determined with the simplified structure and the fault analysis cost can also be reduced by providing a measuring circuit for executing at least two or more measurements among the measurement of lock time until the desired internal clock signal corresponding to the input clock signal can be obtained, measurement of the maximum frequency of the internal clock signal and measurement of jitter of the internal clock signal.

(2) The effect that the clock signal up to higher frequency can be formed stably, in addition to the effect explained above, can be obtained by structuring a clock generation circuit using the PLL circuit to control the oscillation operation of the oscillation circuit to attain matching of the input clock signal inputted from the external terminal and internal clock signal through the control of these clock signals.

(3) In addition to these effects, the effect that the clock signal up to the higher frequency can be stably formed can be attained by structuring a clock generation circuit using a variable delay circuit to form an internal clock signal which has delayed the input signal inputted from the external terminal for the predetermined delay time and a DLL circuit including a control circuit for comparing the phases of the input clock signal and internal clock signal to control the delay time explained above to attain the matching of the phases.

(4) In addition to the above effects, the effect that automatic measurement of the lock time can be realized with the PLL circuit can also be attained with a counter circuit for detecting a synchronization/ synchronization between the input clock signal and internal clock signal with a lock detecting circuit to count up the input clock signal and a latch circuit for receiving output signals of respective stages of the counter circuit and holding the output signals of the counter circuit when an output signal formed with the lock detecting circuit is changed to the synchronous condition from the asynchronous condition.

(5) In addition to the above effects, the effect that the maximum oscillation frequency of the PLL circuit can be measured automatically can be attained by always making the oscillation circuit indicate the UP control signal setting the input corresponding to the internal clock signal supplied to the phase comparator as the fixed level and then providing a counter for counting the oscillation signal of the oscillation circuit and a circuit for extracting the counter value within the reference time formed with the input clock signal.

(6) In addition to the above effects, there can be obtained the effect that determination of the pk—pk jitter can be realized from the delay control signal supplied to the first and second variable delay circuit which change, for the predetermined number of times, to the condition where the output signals of the phase difference circuit are completely in the other level from the condition where these output signals are in one level by forming the first delay signal for the input clock signal with the first variable delay circuit, then forming the second delay signal for the internal clock signal with the second variable delay circuit and forming a binary signal corresponding to a phase difference between the first delay signal and the second delay signal with the phase difference circuit.

(7) In addition to the above effects, there can be obtained the effect that determination of the RMS jitter can be realized from the delay control signal supplied to the first and second variable delay circuit in which, for the predetermined number of times, an output signal of the phase difference circuit changes from the first predetermined value indicating the rate of one level to the second predetermined value indicating the rate of the other level by forming the first delay signal for the input clock signal with the first variable delay circuit, then forming the second delay signal for the internal clock signal with the second variable delay circuit and forming a binary signal corresponding to a phase difference between the first delay signal and the second delay signal with the phase difference circuit.

(8) In addition to the above effects, the effect that the RMS jitter can be determined easily with a binary counter and a binary determination circuit can be attained by setting the predetermined number of times to $2^N$ (N is a positive integer), setting the first predetermined number of times to the value corresponding to about 16% of $2^N$ and setting the second predetermined number of times to the value corresponding to about 84% of $2^N$.

(9) In addition to above effects, there can be obtained the effect that the cycle jitter can be determined from the delay control signal supplied to the third variable delay circuit under the condition where output signals of the phase difference circuit are completely in one level or in the other level for the predetermined number of times and in the condition where one level and the other level become almost identical by forming the first delay signal delayed by one period from the input clock signal with the DLL circuit using the first delay circuit, forming the second delay signal corresponding to one period of the input clock signal from the same control signal with the second delay circuit, forming, through reception of the second delay signal, with the third variable delay circuit, a delayed signal for fine adjustment in the smaller unit delay time corresponding to the control signals of the first and second variable delay circuits and forming a binary signal, with the phase difference circuit, corresponding to the phase difference between the second delay signal and the delay signal for fine adjustment.

(10) In addition to above effects, the effect that the performance test in higher accuracy of PLL or DLL circuit can be conducted with a simplified structure can be attained by comprising the measuring circuit into a test circuit to generate the test signal required for operations of the internal circuit by receiving an input signal inputted via the interface circuit complying to the JTAG, setting the measuring condition via the interface circuit complying to the JTAG and controlling the interface circuit complying to the JTAG to output the result of measurement, as a serial signal, fetched by a plurality of latch circuits connected in serial to fetch the result of measurement.

(11) In addition to above effects, the effect that highly reliable test result can be obtained can also be realized by providing the self-diagnostic function in the measuring circuit for the test circuit.

The present invention has been explained based on the preferred embodiment thereof but the present invention is never limited only to the above embodiment and allows various changes or modifications within the scope not departing from the claims Ho thereof. For example, circuits may be simplified by utilizing the counter and register in common for a plurality of measuring items among those for the PLL circuit or DLL circuit. In this case, since a control circuit to output the result of measurements can also be used in common, further simplification can be realized.

The practical structures of the delay circuit and counter circuit forming the measuring circuit explained above can be varied and modified. The DLL circuit may be a digital control digital DLL and a digital control analog DLL. The present invention can be widely used for various semiconductor integrated circuit devices comprising the PLL circuit or DLL circuit.

The representative effects of the present invention are briefly explained as follows. In a semiconductor integrated circuit device comprising a clock generating circuit to form an internal clock signal corresponding to the input clock signal inputted from an external terminal, the performance of the PLL circuit can be determined up to a higher frequency with the simplified structure and a fault analysis cost can also be reduced by providing a measuring circuit for conducting at least two kinds of measurement among the measurements of lock time until the predetermined internal clock signal corresponding to the input clock signal can be obtained, maximum frequency of the internal clock signal and jitter of the internal clock signal.

What is claimed is:

1. A semiconductor integrated circuit device, comprising:
    a clock generating circuit for forming an internal clock signal corresponding to an input clock signal inputted from an external terminal; and
    a measuring circuit for conducting at least two kinds of measurement among the measurements of a lock time by the time when the predetermined internal clock signal corresponding to the input clock signal is obtained, of the maximum frequency of the internal clock signal and of jitter of the internal clock signal.

2. A semiconductor integrated circuit device according to claim 1, wherein the clock generating circuit is a PLL circuit for controlling the oscillating operation of an oscillation circuit to attain the matching between the input clock signal inputted from an external terminal and the internal clock signal by controlling the oscillation circuit.

3. A semiconductor integrated circuit device according to claim 1, wherein the clock generating circuit is a DLL circuit comprising a variable delay circuit to form the internal clock signal which is delayed for the predetermined delay time from an input clock signal inputted from an external terminal and a control circuit for controlling the delay time to attain the matching between the input clock signal and the internal clock signal by comparing the phases of these clock signals.

4. A semiconductor integrated circuit device according to claim 1, wherein the measuring circuit for measuring the lock time comprising:
    a lock detector for detecting lock/non-lock condition between an input clock signal and an internal clock signal;
    a counter circuit for counting the input clock signal; and
    a latch circuit for receiving an output signal of each stage of the counter circuit to hold an output signal of the counter circuit when an output signal formed by a non-lock detector is changed from the non-lock condition to the lock condition.

5. A semiconductor integrated circuit device according to claim 1, wherein the measuring circuit for measuring the maximum frequency comprising:
    a circuit for always instructing the oscillation circuit to indicate the UP control signal by defining an input corresponding to the internal clock signal supplied to the phase comparator as the fixed level;

a counter for counting up the oscillation signal of the oscillation circuit; and a circuit for extracting the counted value of the counter within the reference time formed using the input clock signal.

6. A semiconductor integrated circuit device according to claim 1, wherein the measuring circuit for measuring the jitter comprising:

a first variable delay circuit forming a first delay signal by receiving the input clock signal;

a second variable delay circuit forming a second delay signal by receiving the internal clock signal; and a phase difference circuit forming a binary signal corresponding to a phase difference between the first delay signal and the second delay signal;

thereby, to determine, for the predetermined number of times, the jitter from a delay control signal supplied to the first and second variable delay circuits changing from the condition where the output signals of the phase difference circuit are all in one level to the condition where the output signals of the phase difference circuit are all in the other level.

7. A semiconductor integrated circuit device according to claim 1, wherein the measuring circuit for measuring the jitter comprising:

a first variable delay circuit forming a first delay signal by receiving the input clock signal;

a second variable delay circuit forming a second delay signal by receiving the internal clock signal; and a phase difference circuit forming a binary signal corresponding to a phase difference between the first and second delay signals;

thereby, to determine the jitter from the delay control signal supplied to the first and second variable delay circuits in which, for the predetermined number of times, an output signal of the phase difference circuit changes from a first predetermined value indicating the rate of one level to a second predetermined value indicating the rate of the other level.

8. A semiconductor integrated circuit device according to claim 7, wherein the predetermined number of times is $2^N$ in which N is a positive integer, the first of the predetermined number of times is about 16% of the $2^N$ and the second of the predetermined number of times is the value corresponding to about 84% of the $2^N$.

9. A semiconductor integrated circuit device according to claim 1, wherein the measuring circuit for measuring the jitter comprising:

a first variable delay circuit controlled with a control signal formed through a phase comparison between the input clock signal and a first delay signal to form the first delay signal delayed by one period from the input clock signal;

a second variable delay circuit structured with a circuit same as the first variable delay circuit to form a second delay signal corresponding to one period of the input clock signal by receiving the control signal;

a third variable delay circuit forming, through the reception of the second delay signal, a delayed signal for fine adjustment in the smaller unit delay time corresponding to control signals of the first and second variable delay circuits; and a phase difference circuit forming a binary signal corresponding to a phase difference between the second delay signal and the delayed signal for fine adjustment;

thereby, to determine the jitter from the delay control signal supplied to the third variable delay circuit under the condition where output signals of the phase difference circuit are all in one level or in the other level for the predetermined number of times and in the condition where one level and the other level become identical.

10. A semiconductor integrated circuit device according to claim 1, wherein the measuring circuit is built in a test circuit to generate a test signal required for the operation of an internal circuit by receiving an input signal inputted via an interface circuit complying to the JTAG, the measuring conditions are set via the interface circuit complying to the JTAG and a plurality of latch circuits are included to fetch the result of the measurement and thereby the result of the measurement fetched by the latch circuits connected serially is outputted as the serial signal via the interface circuit complying to the JTAG.

11. A semiconductor integrated circuit device according to claim 10, wherein the measuring circuit has the self-diagnostic function.

* * * * *